United States Patent
David et al.

(10) Patent No.: US 9,660,152 B2
(45) Date of Patent: *May 23, 2017

(54) SYSTEM AND METHOD FOR SELECTED PUMP LEDS WITH MULTIPLE PHOSPHORS

(71) Applicant: SORAA, INC., Fremont, CA (US)

(72) Inventors: Aurelien J. F. David, San Francisco, CA (US); Arpan Chakraborty, Fremont, CA (US); Michael Ragan Krames, Los Altos, CA (US); Troy Trottier, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/077,387

(22) Filed: Mar. 22, 2016

(65) Prior Publication Data

US 2016/0276550 A1    Sep. 22, 2016

Related U.S. Application Data

(63) Continuation of application No. 13/211,145, filed on Aug. 16, 2011, now Pat. No. 9,293,667.

(60) Provisional application No. 61/502,212, filed on Jun. 28, 2011.

(51) Int. Cl.

| | |
|---|---|
| *H01L 33/50* | (2010.01) |
| *C09K 11/08* | (2006.01) |
| *C09K 11/77* | (2006.01) |
| *H01L 25/075* | (2006.01) |
| *H01L 33/08* | (2010.01) |
| *H01L 33/32* | (2010.01) |
| *H01L 33/48* | (2010.01) |
| *H01L 33/54* | (2010.01) |

(52) U.S. Cl.
CPC ........ *H01L 33/504* (2013.01); *C09K 11/0883* (2013.01); *C09K 11/7721* (2013.01); *C09K 11/7734* (2013.01); *C09K 11/7739* (2013.01); *C09K 11/7774* (2013.01); *H01L 25/0753* (2013.01); *H01L 33/08* (2013.01); *H01L 33/32* (2013.01); *H01L 33/486* (2013.01); *H01L 33/50* (2013.01); *H01L 33/54* (2013.01); *H01L 2924/0002* (2013.01); *Y02B 20/181* (2013.01)

(58) Field of Classification Search
CPC ............ C09K 11/0883; C09K 11/7721; C09K 11/7734; C09K 11/7739; C09K 11/7774; H01L 25/0753; H01L 33/08; H01L 33/32; H01L 33/50; H01L 33/54; H01L 33/486; H01L 33/504; H01L 2924/0002; Y02B 20/181

See application file for complete search history.

(56) References Cited

U.S. PATENT DOCUMENTS 8,905,588 B2 * 12/2014 Krames ............... H01L 25/0753
                                                                    257/98
9,293,667 B2 *  3/2016 David ................ C09K 11/0883

* cited by examiner

*Primary Examiner* — Stephen F Husar

(74) *Attorney, Agent, or Firm* — Saul Ewing LLP

(57) ABSTRACT

An LED pump light with multiple phosphors is described. LEDs emitting radiation at violet and/or ultraviolet wavelengths are used to pump phosphor materials that emit other colors. The LEDs operating in different wavelength ranges are arranged to reduce light re-absorption and improve light output efficiency.

17 Claims, 6 Drawing Sheets

|  | 4% | 5% | 6% |
|---|---|---|---|
| x | 0.466 | 0.464 | 0.462 |
| y | 0.421 | 0.419 | 0.416 |
| CCT[K] | 2695.385 | 2701.813 | 2708.297 |
| Duv | 0.003 | 0.003 | 0.002 |
| CRI (Ra) | 83.157 | 83.291 | 83.377 |
| LER [lm/W] | 304.833 | 302.776 | 300.748 |
| R1 | 97.818 | 97.698 | 97.567 |
| R2 | 91.112 | 91.132 | 91.125 |
| R3 | 75.120 | 75.337 | 75.528 |
| R4 | 90.018 | 90.643 | 91.078 |
| R5 | 90.785 | 90.530 | 90.259 |
| R6 | 73.158 | 73.136 | 73.104 |
| R7 | 79.979 | 80.331 | 80.608 |
| R8 | 67.268 | 67.518 | 67.749 |
| R9 | 36.008 | 36.469 | 36.938 |
| R10 | 71.359 | 71.291 | 71.199 |
| R11 | 75.511 | 75.429 | 75.292 |
| R12 | 49.258 | 47.448 | 45.739 |
| R13 | 94.652 | 94.529 | 94.389 |
| R14 | 85.554 | 85.673 | 85.780 |
| u' | 0.262 | 0.262 | 0.262 |
| v' | 0.532 | 0.531 | 0.530 |

SYSTEM AND METHOD FOR SELECTED PUMP LEDS WITH MULTIPLE PHOSPHORS

This application is a continuation of U.S. application Ser. No. 13/211,145 filed on Aug. 16, 2011, now U.S. Pat. No. 9,293,667, which claims the benefit under 35 U.S.C. §119(e) of U.S. Application No. 61/502,212 filed on Jun. 28, 2011, both of which are hereby incorporated by reference in their entirety.

BACKGROUND OF THE INVENTION

This invention is directed to lighting systems, and in particular, to light emitting diodes (LED) pump light with multiple phosphors.

Solid state lighting is known. Solid state lighting relies upon semiconductor materials to produce light, e.g. by light emitting diodes. Red LEDs are known and use Aluminum Indium Gallium Phosphide or AlInGaP semiconductor materials, among others. Most recently, Shuji Nakamura pioneered the use of InGaN materials to produce LEDs emitting blue light. The blue LEDs led to other innovations such as solid state white lighting and the blue laser diode.

High intensity UV, blue, and green LEDs based upon the InGaN material system have been proposed and demonstrated. Efficiencies have typically been highest in the UV-violet, but drop off as the emission wavelength is increased to blue or green. Unfortunately, achieving high intensity, high-efficiency InGaN-based green LEDs has been problematic. Additionally, InGaN-based LEDs have been costly and difficult to produce on a wide-scale in an efficient manner. Although successful, solid state lighting techniques must be improved for full exploitation of their potential.

SUMMARY OF THE INVENTION

This invention provides pump LED light of selected wavelengths with multiple phosphors. In various embodiments, LEDs emitting radiation at violet and/or ultraviolet wavelengths are used to pump phosphor materials that emit light of a different frequency. The pump LEDs are characterized by having a peak emission wavelength of about 405 to 430 nm under normal operation. They are employed in conjunction with at least a blue phosphor with strong absorption at wavelengths beyond about 405 nm. In certain embodiments, LEDs operating in different wavelength ranges are arranged in a combination to reduce radiation re-absorption and improve light-output efficiency.

This invention provides an optical device which includes a mounting member and at least one light emitting diode overlying a portion of the mounting member. The LED includes a gallium and nitrogen containing substrate having a surface region and a gallium and nitrogen containing buffer layer overlying the surface region. An active region emits electromagnetic radiation with peak wavelengths in a range from about 405 nm to about 430 nm. The LED includes electrical contacts to supply the junction region electrical current. The device additionally includes a mixture of three phosphor materials within a binder material. The mixture of phosphor materials is disposed within a vicinity of the LED interacts with the electromagnetic radiation from the LED to convert the electromagnetic radiation to a wavelength range between about 440 to 650 nanometers. In another embodiment the device includes blue phosphor material within a vicinity of the LED device with strong absorption at wavelengths longer than about 405 nm. The active region is configured to emit electromagnetic radiation whose peak is in the range of about 405 to 430 nanometers while maintaining an internal quantum efficiency of about 70% and greater at a current density of at least 100 A/cm$^2$ in an operating temperature range from about 100° C. to about 150° C.

DETAILED DESCRIPTION OF THE PREFERRED EMBODIMENTS

This invention is directed to lighting systems and to the provision of LED pump light with multiple phosphors. LEDs emitting radiation at violet and/or ultraviolet wavelengths are used to pump phosphor materials that emit different colors. Preferably the pump LEDs have a peak emission wavelength of about 405 to 430 nm under normal operating conditions.

As mentioned above, conventional LED lights sources are often inadequate. For example, one of the most-common approaches to generating high-CRI white LED light consists of LED devices emitting in the 440-470 nm range (often referred to as pump LEDs), which excite two phosphors: a yellow/green phosphor and a red phosphor. This approach is convenient because some yellow/green phosphors, such as Ce:YAG, exhibit high quantum efficiency.

Unfortunately, this approach is also constraining YAG-based phosphors can only be efficiently excited in a narrow spectral range around 460 nm, limiting the wavelength range of the pump LEDs that can be employed. While high internal quantum efficiency (IQE) LED devices can be created at such wavelengths at low current density, their IQE falls rapidly at high current density. This is due to two effects: (a) the presence of large piezoelectric fields which reduce the carrier overlap and therefore increase the carrier lifetime, shifting the IQE curve to lower current density (ref); and (b) the challenges associated with thick active regions emitting around 445 nm (due to both strain-related growth limitations with thick InGaN layers and the difficulty with carrier spreading in a multi-quantum-well system).

Figure 1:
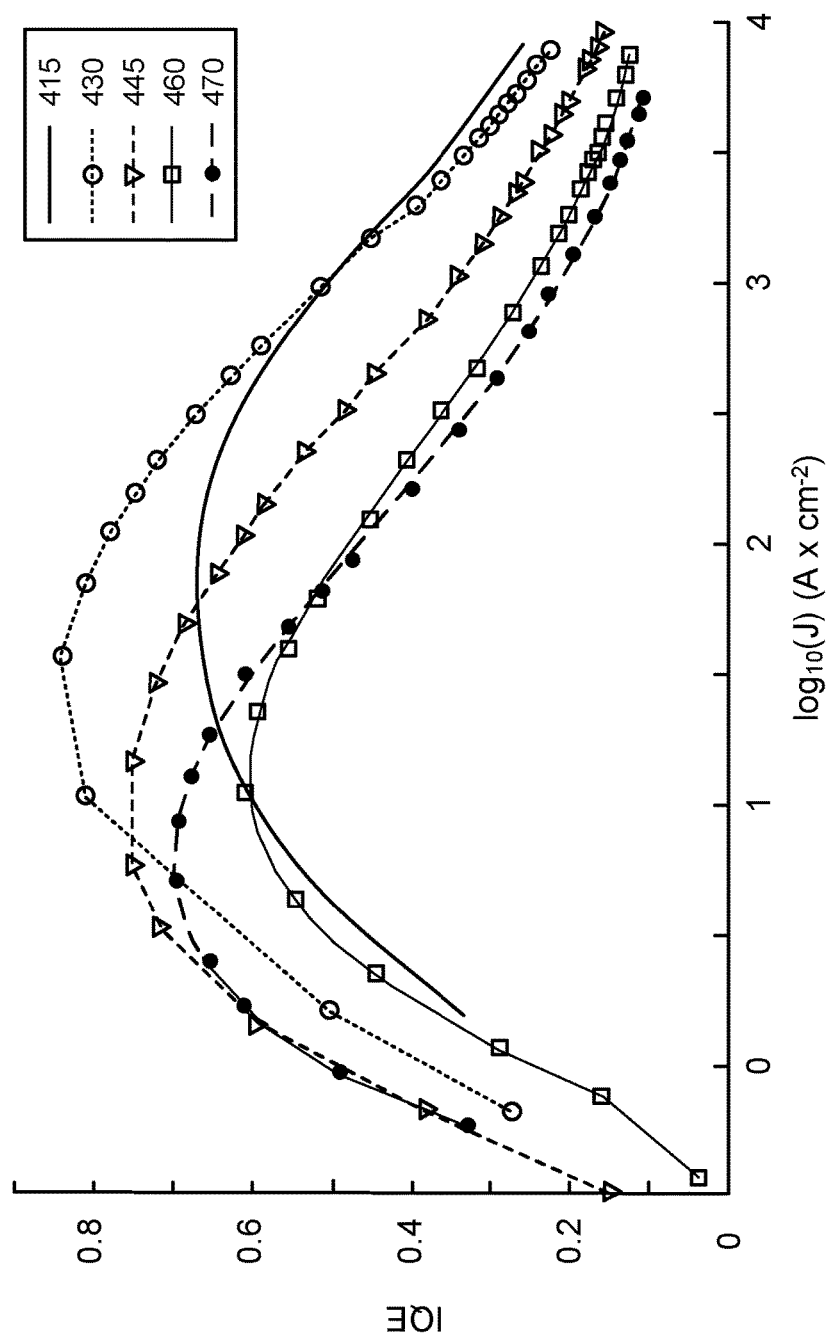
FIG. 1 illustrates the efficiency characteristics of LEDs emitting at various wavelengths.

FIG. 1 illustrates the efficiency behavior of LEDs emitting at various wavelengths. Short-wavelength LEDs (415-430 nm) maintain efficiency at much higher carrier densities than long-wavelength LEDs (445 nm and above). FIG. 1 is taken from "*Influence of polarization fields on carrier lifetime and recombination rates in InGaN-based light-emitting diodes*", A. David et al, *Appl. Phys. Lett.* 97, 033501 (2010), which describes the increase of the polarization fields in longer-wavelength LEDs. The article "*Carrier distribution in (0001)InGaN/GaN multiple quantum well light-emitting diodes*", A. David et al, *Appl. Phys. Lett.* 92, 053502 (2008), discusses the difficulty in spreading carriers between the quantum wells in 450 nm-pump LEDs.

The blue light from the pump LED contributes to the white spectrum. Therefore, the amount of blue light that is transmitted by the phosphors needs to be well-controlled to achieve a given CCT. Variations in the wavelength of the pump LED need to be accounted for in the phosphor composition/loading. Accounting for the differences in wavelength can be a challenging task when manufacturing white LEDs.

State-of-the-art results for 440-nm pump LEDs can be found in the article "*White light emitting diodes with super-high luminous efficacy*", Y. Narukawa et al, *J. Phys. D* 43, 354002 (2010). At room temperature and a current density of about 100 A/cm$^2$, an external quantum efficiency of 65% is reported. Assuming an extraction efficiency of about 90% and a performance drop of about 10% between room temperature and a 100 C junction temperature, this corresponds to an IQE of about 65% at 100 A/cm$^2$ and 100 C.

Another conventional approach consists in using a pump LED whose emission peak is in the 395-405 nm range to pump a system of three or four phosphors. This is advantageous because 400 nm pump LEDs typically retain higher performance at a higher current density than 445 nm pump LEDs, presumably due to the lower piezoelectric fields and to the thick active regions.

Employing an LED emitter whose final spectra is minimally affected (in color or brightness) by the presence or absence of the emitter wavelength in the final spectra allows for very stable performance over drive currents and temperatures. Proper selection of color-stable phosphor materials for the devices range of operation (e.g. a 405 nm emitter's spectral weight) is only 1.5% that of a 450 nm emitter. A 420 nm emitter's spectral weight is still only 10% of that of a 450 nm emitter. Stability in color and flux of a finished phosphor-converted LED is increased dramatically over a traditional blue pump device where as much as 20% of the final spectrum is comprised of the underlying emitter at 450 nm.

The elimination of the need to target a certain amount of emitter light leakage in the final spectra also offers improved color yield in a manufacturing environment. The manufacturing phosphor deposition process for an about 405 nm to 430 nm pump device can accept more process variance without sacrificing large-volume color repeatability. In turn, this allows a manufacturing process to run with higher throughput without loss in repeatability.

Use of three or more component colors (chip emission and at least two phosphors) offers a larger tunable color gamut for a phosphor-converted LED device than does a two-component color system. A large range of tunable colors and color rendering indices become available. A two-color component white LED will only have one possible cross section with the Planckian curve (one point to achieve a balanced white spectrum) whereas a three or more color system allows for infinite tunability along the Planckian curve.

This approach, however, suffers from various limitations:

1. The Stokes loss between the pump wavelengths and the phosphors wavelengths is larger, so more energy is lost in the phosphor down-conversion process. The comparatively larger band gap of a 400 nm pump LED causes a larger operation voltage. The reduced carrier confinement in the active region of a 400 nm pump LED makes it easier for carriers to escape, and therefore decreases the high-temperature performance. Most materials have a significantly larger absorption at 400 nm than at 445 nm (this is the case for high-reflectivity metals such as Al and Ag which are commonly used in LEDs, of silicones, of some substrates such as GaN or SiC, and of Au wirebonds.) which decreases the light-extraction efficiency.

2. There has not been focused development on phosphors for use with 380-430 nm excitation light. This places the performance levels of the available phosphor materials behind the state-of-the-art phosphor performance enjoyed by LED manufacturers employing 450 nm pump LEDs for use with materials such as $Y_3Al_5O_{12}$:$Ce^{3+}$ (YAG-yellow) and CaAlSiN:$Eu^{2+}$ (red) which have had both time and pressure applied to their improvements.

Figure 2:
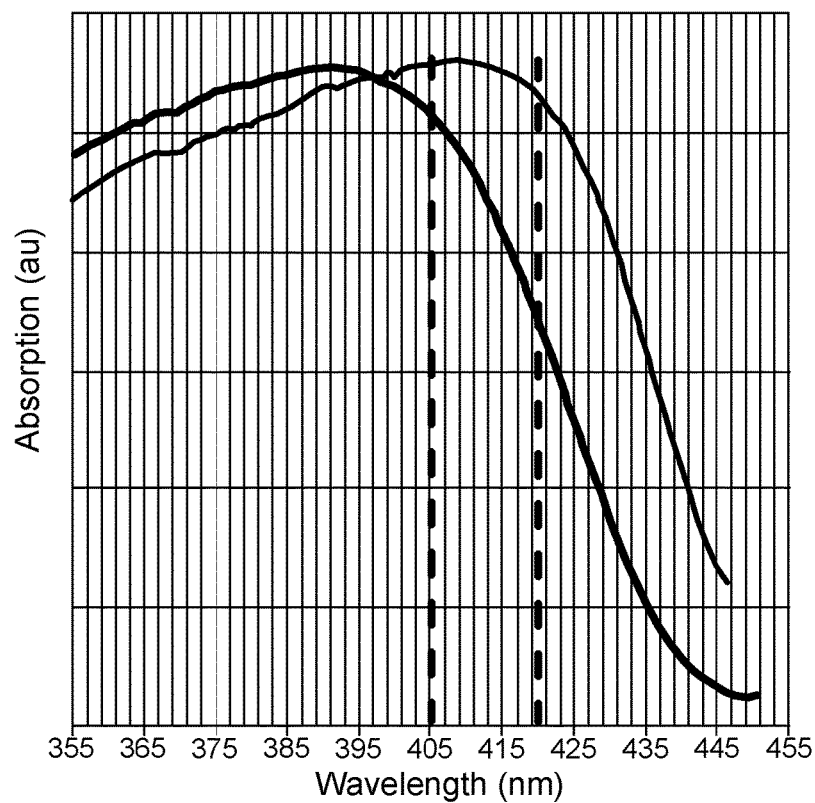
FIGS. 2 and 3 illustrate absorption properties of blue phosphors and the corresponding white LED performance depending on the emission wavelength of the LED.
Figure 3:
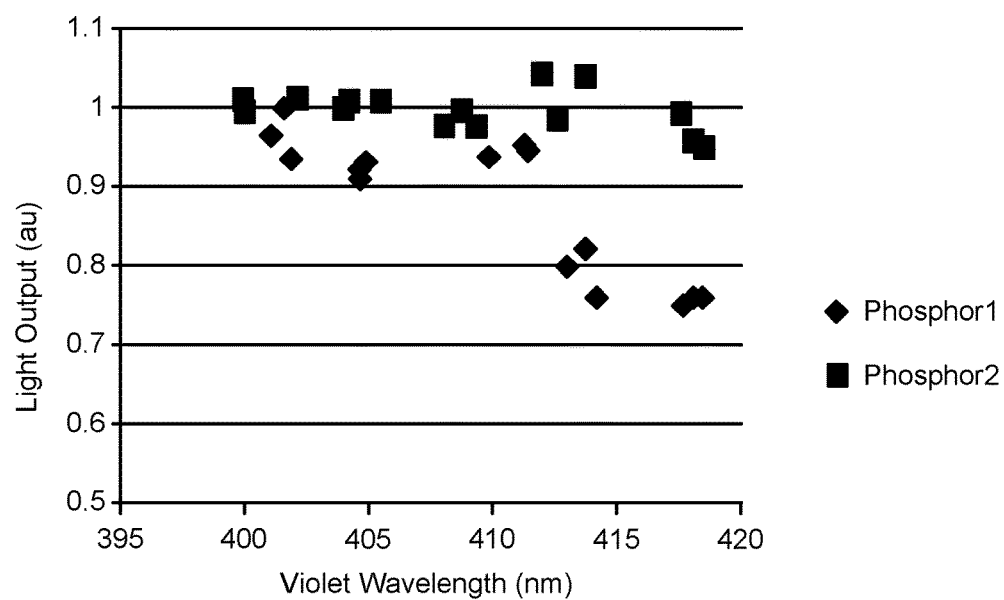

3. Due to this offset in state-of-the-art phosphor material performance, not all of the available phosphors can be used in high performance LED devices. Prime examples are blue phosphors which are not suitable for use with all chip-emission wavelengths. The absorption characteristics of two blue-emitting phosphors are shown in FIG. 2. Vertical lines indicate the position of a 405 nm and 420 nm emitter relative to these two phosphor absorption curves. Though the two materials absorption strengths are similar at 405 nm, they are clearly not the same at 420 nm. This reduction in absorption strength of the first phosphor materially affects the device performance with longer-wavelength emitters. This change in performance is shown in FIG. 3.

This invention provides white LED light sources with high performance. Among other things, the invention provides a new approach to high-CRI white LEDs. For example, the white LED light source comprises pump LED(s) whose peak emission is in the range of about 405 nm to 430 nm and a system of three or more phosphors (such as blue, green, and red). A substantially white spectrum is produced by the phosphor emission.

One advantage of the invention is that a pump LED in the range of about 405 nm to 430 nm can display a very high IQE at high carrier density (similar to a 400 nm pump LED) due to the moderate strain and piezoelectric fields. The carrier confinement in the active region, on the other hand, is significantly improved so that the high-temperature performance is not compromised. The lower band gap compared to a 400 nm LED also enables a lower forward voltage. Therefore, the range of about 405 nm to 430 nm is optimal from the standpoint of pump LED performance. High IQE performance for such LEDs (at a current density of 100 A/cm$^2$ and a junction temperature 100 C) can be better than 70% and even exceed 90%. This is to be compared to about 65% for state-of-the art LEDs emitting at 440 nm as described in the prior art.

In addition, optical absorption in most materials is significantly reduced between 400 nm and about 405 nm to 430 nm, yielding overall larger light-extraction efficiency. Also, as explained above, the use of three or more phosphors to generate white light is advantageous in terms of color control and process stability. Blue phosphors are available with strong absorption in the range of about 405 nm to 430 nm, and with high quantum efficiency. Some examples of blue-emitting phosphors with strong absorption in this wavelength range are $BaMgAl_{10}O17$:$Eu^{2+}$, $Sr_{10}(PO_4)_6Cl_2$:E, $LaAl(Si_{6-z}Al_z)N_{10-z}O_z$:$Ce^{3+}$, a-Sialon:$Ce^{3+}$, (Y,La)—Si—O—N:$Ce^{3+}$, $Gd_{1-x}Sr_{2+x}AlO_{5-x}F_x$:$Ce^{3+}$. The Stokes loss is also mitigated in comparison to a 400 nm pump LED.

Figure 4:
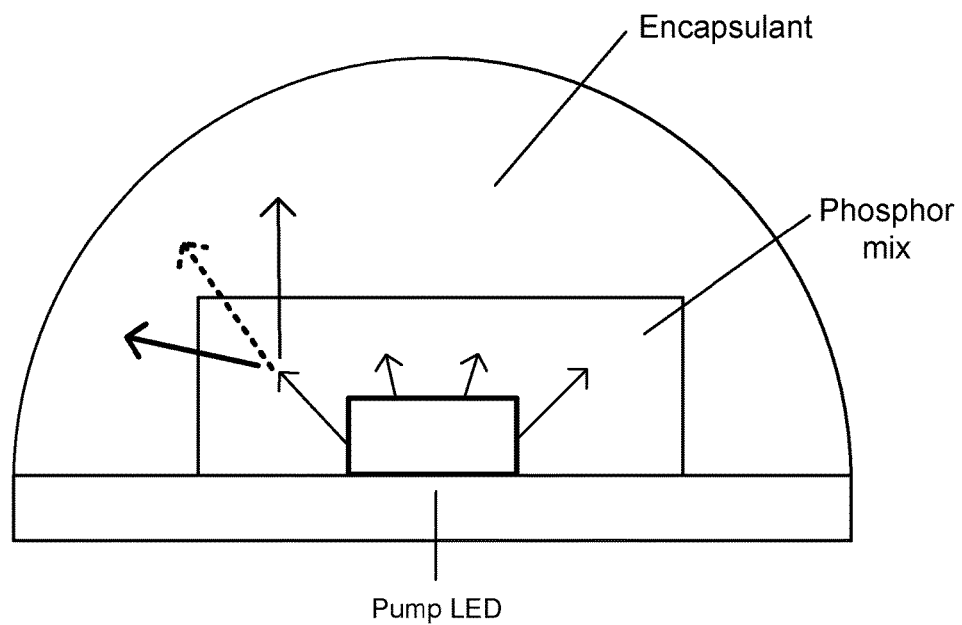
FIG. 4 illustrates an LED with peak emission in the range of about 405-430 nm pumping blue, red, and green phosphors.

FIG. 4 illustrates an embodiment of the invention, where an LED whose peak emission is in the range of about 405 nm to 430 nm pumps blue, red, and green phosphors. As shown in FIG. 4, a pump LED source is provided on a substrate or a submount. For example, the pump LED source emits radiation at a wavelength of about 405 nm to 430 nn. The pump LED source is disposed in a mix of phosphor materials, which absorbs the radiation emitted by the LED source. The phosphor materials are excited by the pump LED and emit blue, green, and red light. In a preferred embodiment, the mix of phosphors is specifically adapted to emit white light, by the combination of emissions from the phosphors. The mix of phosphor materials is disposed in an encapsulant which is substantially transparent to both pump-LED-source and phosphor-emitted light.

Depending on the application, the encapsulant may include various types of materials. In a preferred embodiment, the encapsulant is specifically configured to improve light-extraction efficiency. For example, the encapsulant material can comprise polymeric species. In a preferred embodiment, the pump LED source emits radiation in the wavelength range from about 405 nm to 430 nm and pumps three phosphors (e.g., a blue, a green, and a red phosphor) that are mixed together, and the phosphor mix converts a substantial fraction of the pump LED source light to longer-wavelength light. Of course, the phosphor mix may contain additional phosphors, e.g. an amber phosphor can be added to increase CRI.

In various embodiments, the wavelength emitted by the LED changes due to changes in temperature. For example, a pump LED emits radiation at a wavelength of about 398 nm at room temperature. When temperature increases to about 120° C., the pump LED emits radiation about 405 nm. Typically, high current and/or high temperature are the main causes of wavelength shift. For example, for each increase of 23° C. in operating temperature, the wavelength of the radiation emitted by the pump LED increases by 1 nm. The encapsulant and the phosphor material used in various embodiments of the invention can compensate for the wavelength shift.

Figure 5:
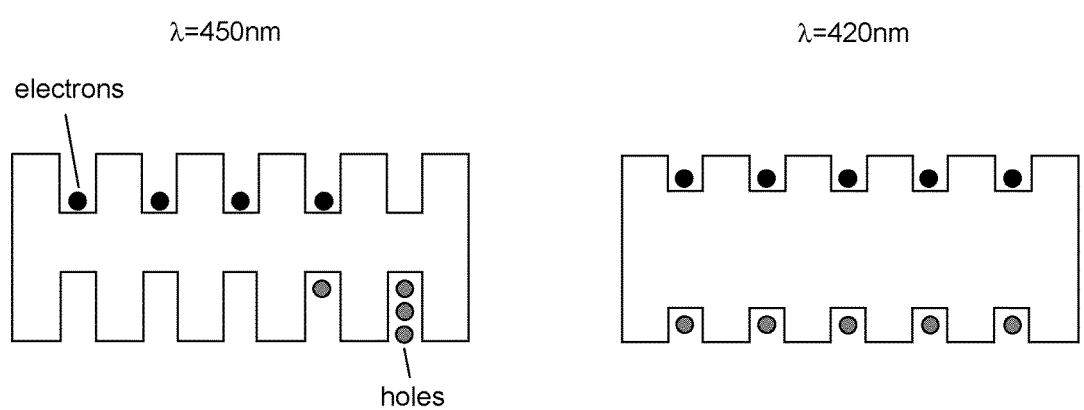
FIG. 5 illustrates carrier spreading in multi-quantum well LEDs emitting at 450 nm (left) and 420 nm (right)

FIG. 5 illustrates carrier spreading in multi-quantum well (MQW) LEDs emitting at 450 nm (left) and 420 nm (right). In a 450 nm-emitting scheme, the energy barriers are larger, which can impede spreading of the holes between the quantum wells. As shown, electrons are more or less spread evenly, while holes are not. In contrast, in a 420 nm-emitting scheme, the energy barriers are lower and hole spreading is thus improved, thereby increasing the effective volume of the active region. Better optimized carrier spreading is achieved by embodiments of the present invention. More specifically, carrier confinement can be reduced compared to that a 450 nm pump LED, which enables better carrier spreading in a MQW system. Therefore, one can employ a thick active region (for instance, more than 10 nm thick or more than 50 nm thick) and inject carriers efficiently across this active region, as illustrated in FIG. 5.

Figure 6:
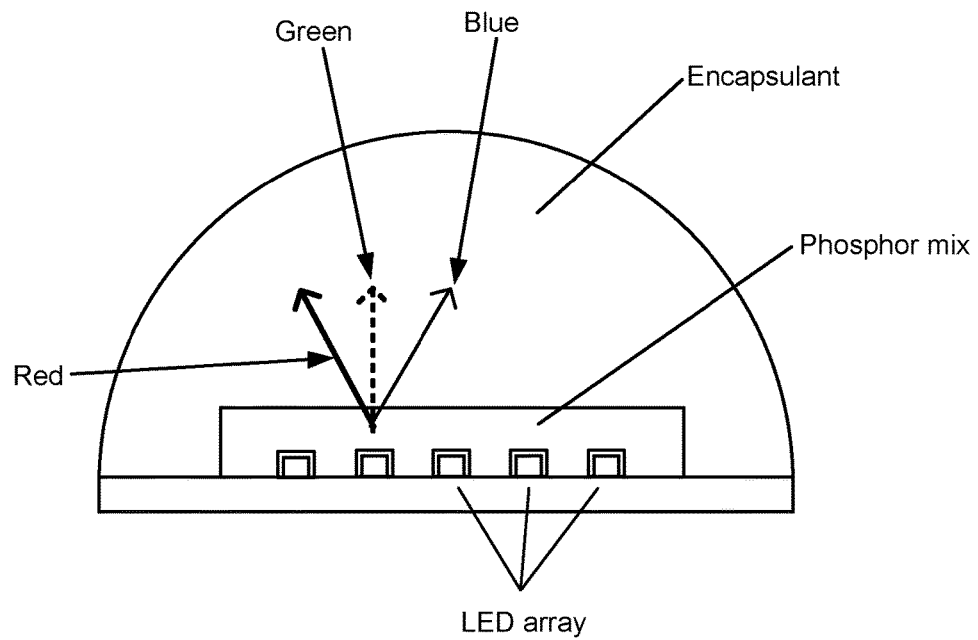
FIG. 6 illustrates pump LEDs configured as an array.

FIG. 6 illustrates an embodiment of the invention where five pump LEDs are arranged in an array. In this implementation the LEDs emit at about 405 nm to 430 nm. The LEDs are disposed a phosphor mix that is specifically made for color conversion. As described above, the phosphor mix comprises phosphor materials which have a high absorption of the light emitted by the pump LEDs. For example, the phosphor mix comprises one or more of the following materials: $BaMgAl_{10}O17:Eu^{2+}$, $Sr_{10}(PO_4)_6Cl_2:E$, $LaAl(Si_{6-z}Al_z)N_{10-z}O_z:Ce^{3+}$, a-Sialon:$Ce^{3+}$, (Y,La)—Si—O—N:$Ce^{3+}$, $Gd_{1-x}Sr_{2+x}AlO_{5-x}F_x:Ce^{3+}$. The phosphor mix is prepared for converting the light from the pump LEDs to light in other colors, such as red, green, and/or blue. When the light in different colors is combined, preferably substantially white light is produced. The mix of phosphor materials is disposed in an encapsulant, which is substantially transparent to both pump-LED and phosphor-emitted light. In a preferred embodiment, the encapsulant is specifically configured to improve light extraction efficiency and is formed from polymeric species.

Figure 7:
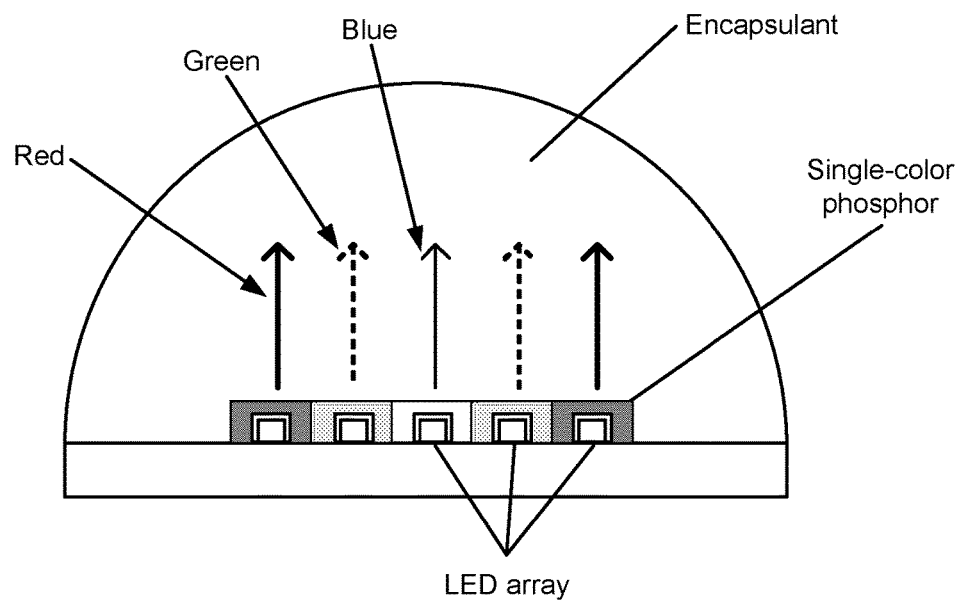
FIG. 7 illustrates pump LEDs configured as an array, with a pixelated phosphor composition.

FIG. 7 illustrates an embodiment of the invention where the pump LEDs are arranged in an array, and the phosphor composition is varied spatially in a pixilated configuration. Here, separate spatial regions perform conversion to red, green, and blue light. As shown in FIG. 7, five LEDs are arranged in an array configured to pump phosphor materials. Single-color phosphor materials in different colors absorb radiation emitted by the LEDs and re-emit light in a color associated with the phosphor material. The phosphor materials are arranged in a pixelated fashion over the LEDs. The pixelated pattern is specifically created to create a mix of emissions whose combination produces light that is substantially white in color.

In a preferred embodiment, the LEDs emit radiation in substantially the same color (e.g., about 405 nm to 430 nm in wavelength), and the radiation from the LEDs pumps the single-color phosphor materials that are in different spatial locations. In return, the colored phosphor materials emit colored light. For example, the phosphor materials, as shown in FIG. 7, emit respectively red, green, and blue light. In the configuration shown in FIG. 7, the type of pump LEDs and/or the phosphors can be varied across the array based on the color needed and the type of LEDs used.

Figure 8:
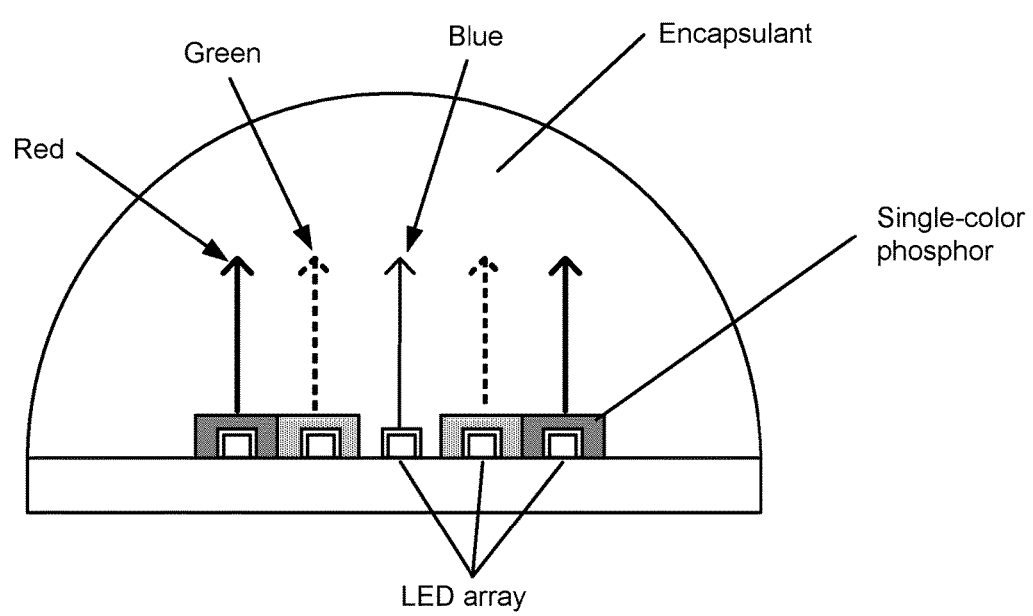
FIG. 8 illustrates pump LEDs configured as an array with two LED emission wavelengths.

FIG. 8 illustrates an embodiment of the invention where the pump LEDs are arranged in an array, and two LED emission wavelengths are employed. Short-wavelength LEDs (about 405 nm to 430 nm) pump red and green phosphors, while longer-wavelength LEDs (440 nm to 460 nm) emit blue light. As shown in FIG. 8, five LED devices form an LED array positioned on a substrate or submount. More specifically, the LED device in the middle emits blue light (e.g., wavelength of about 440 nm to 460 nm), while the other LED devices emit radiation in substantially violet (e.g., about 405 nm to 430 nm) wavelength range. The violet LED devices are disposed in colored phosphor materials, where the LED devices pump the phosphor material which emits a colored light, e.g. red light. Similarly, the green phosphor material, upon absorbing substantially violet radiation, emits green light. The blue LED device is not disposed within a phosphor material, and as a result the blue light generated by the blue LED devices is emitted directly.

Depending on the application, the LEDs can be arranged in array geometry using several pump LEDs in combination with blue or red LEDs that are not configured to pump phosphor material. It is to be appreciated that the arrangement of LEDs as shown in FIG. 8 can help reduce light absorption. For example, inter-die absorption is reduced at about 405 nm to 430 nm relative to 400 nm (because of the lower substrate absorption), which is an additional advantage of using a longer wavelength pump LED.

Different arrangements of phosphor materials and LED devices enable different light colors to be obtained. In a preferred embodiment, the LED devices are grown on a non-polar or semi-polar substrate. In certain embodiments, the LED devices can be grown on a low-dislocation-density substrate ($<1\times10^7$ dislocations/$cm^2$) to enable reliable operation at high current density and high temperature.

Wavelength conversion materials can be ceramic or semiconductor particle phosphors, ceramic or semiconductor plate phosphors, organic or inorganic down converters, up converters (anti-stokes), nano-particles and other materials which provide wavelength conversion. Some examples are listed below $(Sr_n,Ca_{1-n})_{10}(PO_4)_6*B_2O_3:Eu^{2+}$ (wherein $0 \le n \le 1$)
$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$Sr_2Si_3O_8*2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2(Mg,Zn)Si_2O_7:Eu^{2+}$
$(Mg,Ca,Sr,Ba,Zn)_2Si_{1-x}O_{4-2x}:Eu^{2+}$ (wherein $0 \le x \le 0.2$)
$(Sr,Ca,Ba)(Al,Ga)_2S_4:Eu^{2+}$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$(Y,Gd,Tb,La,Sm,Pr,Lu)_3(Sc,Al,Ga)_{5-n}O_{12-3/2n}:Ce^{3+}$ (wherein $0 \le n \le 0.5$)
$ZnS:Cu+,Cl-$
$(Y,Lu,Th)_3Al_5O_{12}:Ce^{3+}$
$ZnS:Cu+,Al3+$
$ZnS:Ag+,Al3+$
$ZnS:Ag+,Cl-$
$(Ca, Sr) Ga_2S_4:Eu^{2+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$CaWO_4$
$(Y,Gd,La)_2O_2S:Eu^{3+}$
$(Y,Gd,La)_2O_3:Eu^{3+}$
$(Ba,Sr,Ca)_nSi_nN_n:Eu^{2+}$ (where $2n+4=3n$)
$Ca_3(SiO_4)Cl_2:Eu^{2+}$
$(Y,Lu,Gd)_{2-n}Ca_nSi_4N_{6+n}C_{1-n}:Ce^{3+}$, (wherein $0 \le n \le 0.5$)
$(Lu,Ca,Li,Mg,Y)$ alpha-SiAlON doped with $Eu^{2+}$ and/or $Ce^{3+}$
$(Ca,Sr,Ba)SiO_2N_2:Eu^{2+},Ce^{3+}$
$(Sr,Ca)AlSiN_3:Eu^{2+}$
$CaAlSi(ON)_3:Eu^{2+}$
$Sr_{10}(PO_4)_6Cl_2:Eu^{2+}$
$(BaSi)O_{12}N_2:Eu^{2+}$
$SrSi_2(O,Cl)_2N_2:Eu^{2+}$
$(Ba,Sr)Si_2(O,Cl)_2N_2:Eu^{2+}$
$LiM_2O_8:Eu^{3+}$ where M=(W or Mo)

In the list above, it is understood that when a phosphor has two or more dopant ions (i.e. those ions following the colon in the above phosphors), this means that the phosphor has at least one (but not necessarily all) of those dopant ions within the material. That is, as understood by those skilled in the art, this type of notation means that the phosphor can include any or all of those specified ions as dopants in the formulation.

In certain embodiments, quantum-dot-based phosphors are used for color conversion purposes. Quantum dot materials are a family of semiconductor and rare earth doped oxide nanocrystals whose size and chemistry determine their luminescent characteristics. Typical chemistries for the semiconductor quantum dots include well known (ZnxCd1−x) Se [x=0 ... 1], (Znx,Cd1-x)Se[x=0 ... 1], Al(AsxP$_{1-x}$) [x=0 ... 1], (Znx,Cd1-x)Te[x=0 ... 1], Ti(AsxP1−x) [x=0 ... 1], In(AsxP1−x) [x=0 ... 1], (AlxGa1−x)Sb [x=0 ... 1], (Hgx,Cd1-x)Te[x=0 ... 1] zincblende semiconductor crystal structures. Published examples of rare-earth doped oxide nanocrystals include Y2O3:Sm3+, (Y,Gd)2O3:Eu3+, Y2O3:Bi, Y2O3:Tb, Gd2SiO5:Ce, Y2SiO5:Ce, Lu2SiO5:Ce, Y3Al5)12:Ce but should not exclude other simple oxides or orthosilicates.

In certain embodiments, the present invention provides a two-phosphor violet pumped white LED, which can be used for illumination. In a specific embodiment, a cyan phosphor and an orange phosphor are used with violet-pumped LED chips. For example, violet chips emitting radiation at wavelength of about 400~440 nm are provided. In this configuration, the emission of the two phosphors substantially determine the chromaticity and color quality of the white light. For example, color is determined primarily by the mix of two phosphors, and pump light leakage is typically minimal and not very eye-sensitive. This approach combines the advantages of reduced phosphor complexity and cost with the simplified color tuning of a two-phosphor system. Moreover, the low eye sensitivity of the violet pump ensures that color targeting in manufacturing with high yield is provided, unlike the case for blue-pumped systems in which case tight control over blue light leakage is necessary for maintaining tight control over chromaticity spread in high-volume manufacturing.

Figure 9:
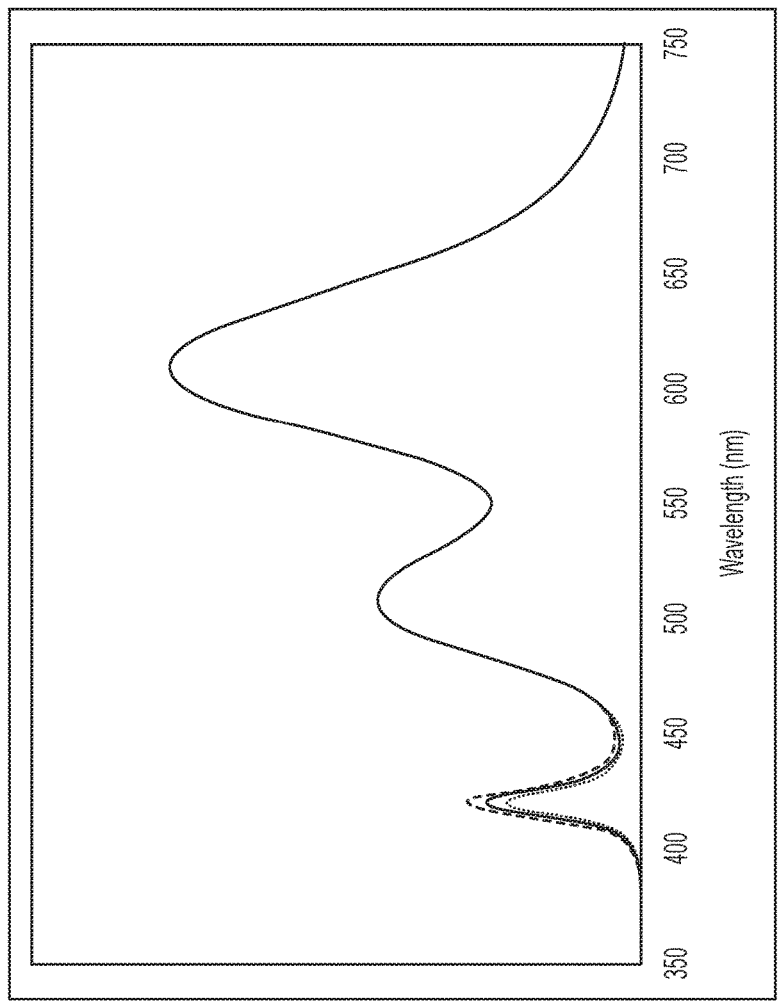
FIG. 9 is a simplified diagram illustrating emission spectrum of LED a two-phosphor violet pumped white LED according to embodiments of the present invention.

FIG. 9 is a diagram illustrating the emission spectrum of a two-phosphor violet pumped white LED. In this example, a cyan phosphor G1758™ and an orange phosphor O6040™ from Intematix Corporation are combined and pumped by a ~420 nm emitting LED. It is to be appreciated that other types of cyan and orange phosphor can be used as well. Other phosphor combinations and other choices of pump emission wavelength in such a configuration are possible. In FIG. 9, the violet pump LED leakage is varied +/−20% relative to an absolute level of 5% leakage. For all three cases, the color rendering index (CRI) is at about 83 at a CCT of approximately 2700K. The variation in chromaticity between the three spectra is very small, with the total deviation from the Planckian at less than 0.004 in terms of u', v'. The lumen efficacy is at about 301-305 lm/Wopt. One of the benefits is that the configuration uses long wavelength pump chips (e.g., in this case 420 nm), which increases light extraction efficiency and package efficiency, reduces forward voltage and Stokes loss, compared to shorter wavelength pump LEDs. In addition, by avoiding blue phosphor, this configuration removes one component in loss in efficiency, reduces overall phosphor loading, and reduces cost and complexity.

While the above is a full description of the specific embodiments, various modifications, alternative constructions, and equivalents may be used. Therefore, the above description and illustrations should not be taken as limiting the scope of the present invention which is defined by the appended claims.

The invention claimed is:

1. An optical device comprising:
   a mounting member;
   at least one light emitting diode (LED) provided overlying a portion of the mounting member, the at least one LED comprising an active region configured to emit electromagnetic radiation within a range from 405 to 430 nanometers;
   a mixture of phosphor materials including a first phosphor material, a second phosphor material, and a third phosphor material, the mixture of phosphor materials disposed within a vicinity of the at least one LED and configured to interact with the electromagnetic radiation to substantially convert the electromagnetic radiation within the wavelength range from 405 nm to 430 nm to wavelengths within a range from 440 nm to 650 nm; and wherein the first phosphor material comprises a blue phosphor having an absorption peak in a wavelength range from 405 nm to 430 nm.

2. The device of claim 1 wherein the LED comprises a bulk GaN substrate.

3. The device of claim 2, wherein the substrate has a polar orientation.

4. The device of claim 2, wherein the substrate has a dislocation density less than $1E7/cm^2$.

5. The device of claim 1, wherein the first phosphor material has an absorption at 430 nm which is at least 31% of its value at the absorption peak.

6. The device of claim 1, wherein the absorption in the wavelength range from 405 nm to 430 nm varies by no more than ±15%.

7. The device of claim 1, wherein the absorption coefficient is within a range from 1 to 40 $cm^{-1}$.

8. The device of claim 1, wherein the device emits substantially white light.

9. The device of claim 1, wherein the LED has an internal quantum efficiency of at least 70% at a current density of 100 $A·cm^{-2}$ and a junction temperature of 100° C.

10. The device of claim 1, wherein the at least one LED comprises a plurality of LEDs in an array configuration.

11. The device of claim 10, wherein the wavelength of the plurality of LEDs varies across the array.

12. The device of claim 1 wherein the blue phosphor has a peak emission wavelength in the range between 440 nm and 480 nm and a spectral full width half maximum (FWHM) of at least 10 nm.

13. The device of claim 1 wherein the blue phosphor is selected from $BaMgAl_{10}O_{17}:Eu^{2+}$, $Sr_2P_2O_7:Eu^{2+}$, $Sr_6P_5BO_{20}:Eu^{2+}$, $(SrCa)_2B_5O_9Cl:Eu^{2+}$, $Sr_5Cl(PO_4)_3:Eu^{2+}$, $Ca_2P_2O_7:Eu^{2+}$, $ZnS:Ag,Cl$, $Sr_{10}(PO_4)_6Cl_2:Eu^{2+}$, $LaAl(Si_{6-z}Al_z)N_{10-z}O_z:Ce^{3+}$, a-Sialon:$Ce^{3+}$, $(Y,La)-Si-O-N:Ce^{3+}$, $Gd_{1-x}Sr^{2+}{}_{2+x}AlO_{5-x}F_x:Ce^{3+}$, and a combination of any of the foregoing.

14. The device of claim 1 wherein the mixture of phosphor materials is such that the device emits light on or near the Planckian curve (du'v'<0.01) with average color rendering of at least 75.

15. The device of claim 1 wherein, the electromagnetic radiation from the active region is substantially free from wavelengths less than 405 nanometers and greater than 440 nanometers.

16. The device of claim 1, wherein the mixture of phosphors varies in either a horizontal or a vertical direction of the device.

17. The device of claim 1, wherein the device emits light having a leakage of the electromagnetic radiation from the color conversion material that is from about 4% to about 6% of the total emitted power.

\* \* \* \* \*